United States Patent
Tseng

(10) Patent No.: US 8,569,986 B2
(45) Date of Patent: Oct. 29, 2013

(54) DEMAGNETIZATION DETECTION DEVICE AND DEMAGNETIZATION DETECTION METHOD THEREOF

(75) Inventor: Jen Chih Tseng, Taoyuan Hsien (TW)

(73) Assignee: Delta Electronics, Inc. (TW)

( * ) Notice: Subject to any disclaimer, the term of this patent is extended or adjusted under 35 U.S.C. 154(b) by 191 days.

(21) Appl. No.: 13/245,973

(22) Filed: Sep. 27, 2011

(65) Prior Publication Data

US 2013/0009583 A1    Jan. 10, 2013

(30) Foreign Application Priority Data

Jul. 4, 2011  (TW) .............................. 100123490 A

(51) Int. Cl.
*H02P 7/00*   (2006.01)

(52) U.S. Cl.
USPC ............... 318/490; 318/139; 702/60; 702/63; 702/61; 702/64; 702/141; 702/142; 702/182; 702/65; 320/136; 320/134; 320/127; 320/132; 700/304; 700/302; 324/600

(58) Field of Classification Search
USPC .......... 318/490, 139; 702/60, 61, 63, 64, 141, 702/142, 182, 65; 320/136, 134, 127, 132; 700/304, 302; 324/600
See application file for complete search history.

(56) References Cited

U.S. PATENT DOCUMENTS

| | | | | |
|---|---|---|---|---|
| 7,173,397 B2 * | 2/2007 | Kinoshita et al. | ............. | 320/134 |
| 8,140,280 B2 * | 3/2012 | Kasai | ............... | 702/63 |
| 2008/0100244 A1 * | 5/2008 | Amagasa | ...................... | 318/434 |
| 2010/0109586 A1 * | 5/2010 | Matsui et al. | ........... | 318/400.04 |
| 2012/0146463 A1 * | 6/2012 | Ng et al. | ....................... | 310/338 |
| 2012/0146683 A1 * | 6/2012 | Tanimoto et al. | ........ | 324/765.01 |

* cited by examiner

Primary Examiner — Rita Leykin

(74) Attorney, Agent, or Firm — Cantor Colburn LLP

(57) ABSTRACT

A demagnetization detection device and a demagnetization detection method thereof are provided. The demagnetization detection device is for use in a power control unit which is electrically connected to a testing permanent magnet motor. The power control unit is electrically connected to a direct current power source. The demagnetization detection device is configured to detect a testing voltage value and a testing current value of the direct current power source, and to compute a testing power value of the direct current power source according to the testing voltage value and the testing current value. The demagnetization detection device determines the difference between the testing power value and a standard power value, and then determines whether the testing permanent magnet motor is in a demagnetization status according to the difference.

8 Claims, 5 Drawing Sheets

| Power value | Torque | Rotation speed |
|---|---|---|
| Standard power value 24 | Standard torque 42 | Standard rotation speed 44 |
| . . . . . . | . . . . . . | . . . . . . |

DEMAGNETIZATION DETECTION DEVICE AND DEMAGNETIZATION DETECTION METHOD THEREOF

This application claims priority to Taiwan Patent Application No. 100123490 filed on Jul. 4, 2011, which is hereby incorporated by reference in its entirety.

CROSS-REFERENCES TO RELATED APPLICATIONS

Not applicable.

BACKGROUND OF THE INVENTION

1. Field of the Invention

The present invention relates to a demagnetization detection device and a demagnetization detection method thereof; and more particularly, the demagnetization detection device and the demagnetization detection method thereof of the present invention determines whether a testing permanent magnet motor is demagnetized by detecting the difference between the power value of a direct current (DC) power source of a power control unit and a standard power value in real time.

2. Descriptions of the Related Art

Due to the rapid development of material science and technologies, the manufacturing processes of permanent magnets with a high magnetic energy have become increasingly sophisticated, and related industries have also benefited from this development. For example, over recent years, immense efforts have been made in the electromobile industry at home and abroad to develop permanent magnet motors in the hope that by virtue of the superior performance of permanent magnets, the permanent magnet motors can be made to have a higher power density and higher efficiency.

When a permanent magnet motor is used for a driving device of an electromobile, a full-range flux-weakening control is usually adopted for the permanent magnet motor to deliver ideal output performance, i.e., to satisfy the requirements of a large torque at low rotation speeds and the ability to operate at a high rotation speed. In other words, through the full-range flux-weakening control, the magnetism of the permanent magnet motor during operation can be adjusted to further control the operations of the driving device of the electromobile at various rotation speeds and torque levels.

However, when the full-range flux-weakening control is adopted for the permanent magnet motor, the permanent magnet of the permanent magnet motor is exposed to a demagnetizing field for a long time, which will cause an accumulation of heat energy in the rotor of the permanent magnet motor due to the iron loss. Once the accumulated heat energy causes the temperature of the permanent magnet to go beyond the limitation of the magnetic flux density—magnetic field strength curve (i.e., the B-H curve) thereof, the permanent magnet would be demagnetized. Furthermore, if the permanent magnet is demagnetized, the magnetic flux density and the coercive field thereof will be weakened abruptly to cause an irreversible demagnetization status; i.e., even after the temperature of the demagnetized permanent magnet decreases later, the magnetic flux density and the coercive field that have been weakened will not restore their original statuses.

Accordingly, once the permanent magnet of the permanent magnet motor is demagnetized, the operational torque of the permanent magnet motor will decrease abruptly to cause abnormal conditions of the electromobile that uses the permanent magnet motor as a driving device. As an example, when the permanent magnet motor is used for an electromobile, the operational torque is determined by a force applied by the driver to the accelerator. In case the permanent magnet of the permanent magnet motor is demagnetized, the actual operational torque of the permanent magnet motor will become smaller than what is expected. Consequently, if the permanent magnet of the permanent magnet motor is demagnetized during the driving process, the driver will be unable to manipulate the electromobile by operating the accelerator as expected, which leads to a dangerous situation.

In the prior art, to avoid overheating of the permanent magnet motor, a temperature sensing element is usually disposed in the stator of the permanent magnet motor to sense the temperature of the permanent magnet motor during operation. However, the temperature sensing element disposed in the stator is only able to measure variations in temperature of the stator but cannot detect the temperature of the rotor accurately, let alone, detect the temperature of the permanent magnet of the permanent magnet motor and whether the permanent magnet is demagnetized. Therefore, the way of determining the temperature of the whole permanent magnet motor by merely detecting the stator's temperature and determining whether the permanent magnet is demagnetized according to the temperature thus detected presents significant errors and great uncertainties.

Accordingly, an urgent need exists in the art to provide a solution capable of accurately and effectively detecting whether a permanent magnet motor is demagnetized.

SUMMARY OF THE INVENTION

The primary objective of the present invention is to provide a demagnetization detection device and a demagnetization detection method thereof, which are mainly for use in a power control unit electrically connected to a testing permanent magnet motor and are capable of determining whether the testing permanent magnet motor is in a demagnetization status by detecting variations of a power value of a direct current (DC) power source electrically connected to the power control unit.

To achieve the aforesaid objective, the present invention provides a demagnetization detection device. The demagnetization detection device is for use in a power control unit electrically connected to a testing permanent magnet motor. The power control unit is further electrically connected to a direct current (DC) power source. The demagnetization detection device comprises a memory, a voltage detector, a current detector, and a processing unit electrically connected to the memory, the voltage detector and the current detector. The memory is configured to store a corresponding relation between a standard power value and a standard torque as well as a standard rotation speed of a standard permanent magnet motor. The voltage detector is configured to detect a testing voltage value of the direct current power source. The current detector is configured to detect a testing current value of the direct current power source. The processing unit is configured to calculate a testing power value of the direct current power source according to the testing voltage value and the testing current value, wherein the testing power value corresponds to a testing torque and a testing rotation speed of the testing permanent magnet motor. The processing unit is further configured to determine a difference between the testing power value and the standard power value when the testing torque is equal to the standard torque and the testing rotation speed is equal to the standard rotation speed based on the corresponding relation; furthermore, the processing unit also determines whether the testing permanent magnet motor is in a demagnetization status according to the difference.

To achieve the aforesaid objective, the present invention further provides a demagnetization detection method for use in a demagnetization detection device. The demagnetization detection device is for use in a power control unit electrically connected to a testing permanent magnet motor. The power control unit is further electrically connected to a DC power source. The demagnetization detection method comprises the following steps: (a) storing a corresponding relation between a standard power value and a standard torque as well as a standard rotation speed of a standard permanent magnet motor; (b) detecting a testing voltage value of the direct current power source; (c) detecting a testing current value of the direct current power source; (d) calculating a testing power value of the direct current power source according to the testing voltage value and the testing current value, wherein the testing power value corresponds to a testing torque and a testing rotation speed of the testing permanent magnet motor; and (e) determining a difference between the testing power value and the standard power value for determining that the testing permanent magnet motor is in a demagnetization status when the testing torque is equal to the standard torque and the testing rotation speed is equal to the standard rotation speed based on the corresponding relation.

With the technical features disclosed above, the demagnetization detection device and the demagnetization detection method thereof of the present invention can effectively and accurately detect whether a permanent magnet motor is in a demagnetization status to further ensure safety during the driving of an electromobile that uses the permanent magnet motor.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 1B is a schematic view illustrating the corresponding relation between a standard power value and a standard torque as well as a standard rotation speed in the first embodiment of the present invention;

DESCRIPTION OF THE PREFERRED EMBODIMENT

In the following descriptions, the present invention will be explained with reference to embodiments thereof. However, these embodiments are not intended to limit the present invention to any specific environment, applications or particular implementations described in these embodiments. Therefore, the description of these embodiments is only for the purpose of illustration rather than to limit the present invention, and the scope of the present invention shall be governed by the claims. It should be appreciated that in the following embodiments and attached drawings, elements unrelated to the present invention are omitted from depiction; and dimensional relationships among individual elements in the attached drawings are illustrated only for the ease of understanding, but not to limit the actual scale.

Figure 1A:
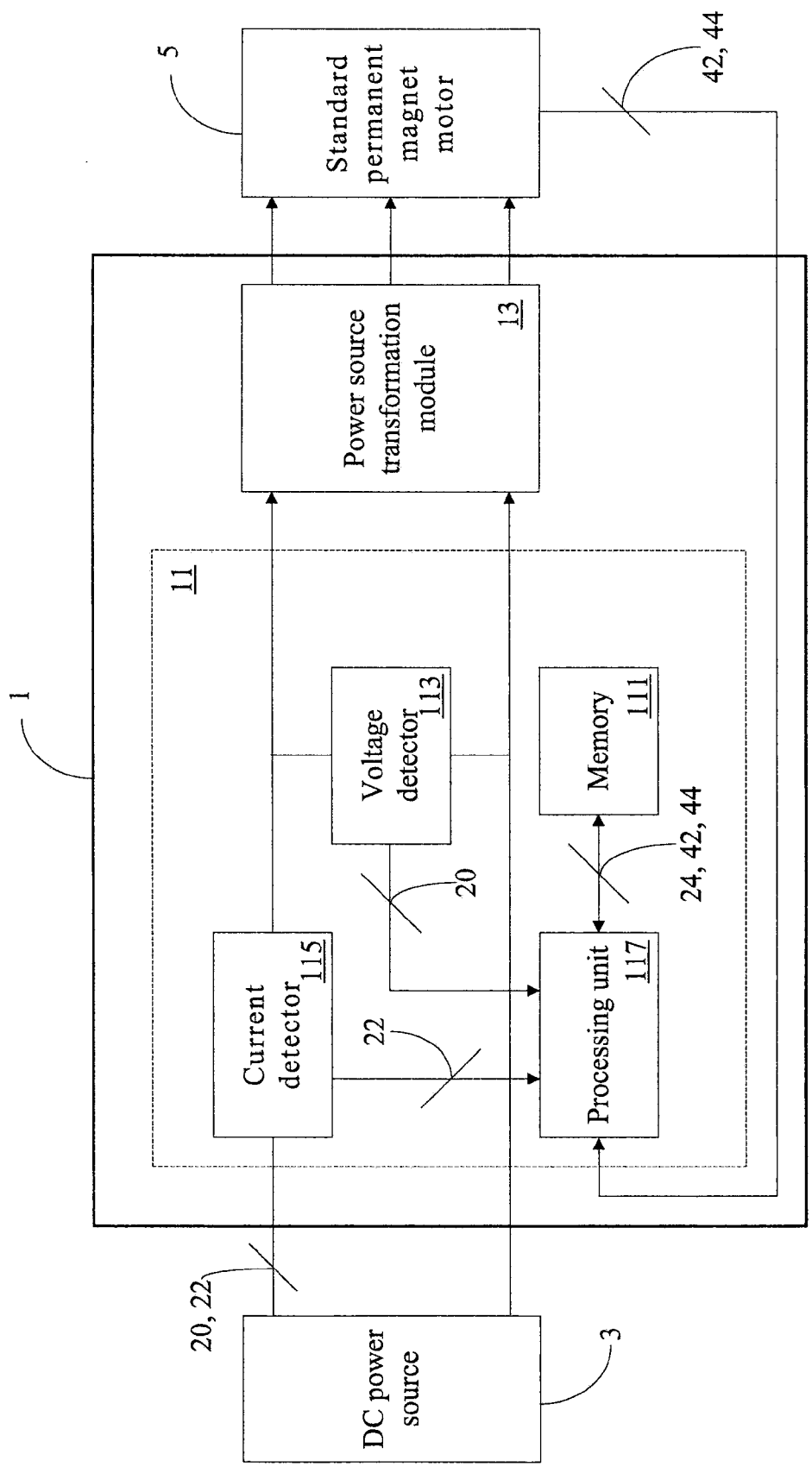
FIG. 1A is a schematic view illustrating how the initial standardization is carried out by a demagnetization detection device according to a first embodiment of the present invention.

FIG. 1A illustrates a schematic view illustrating how the initial standardization is carried out by a demagnetization detection device 11 according to a first embodiment of the present invention. Before the demagnetization detection device 11 can be actually used for demagnetization detection, an initial standardization process must be carried out by using a standard permanent magnet motor to record the statuses of a normal permanent magnet motor under various operation conditions.

First, as shown in FIG. 1A, the demagnetization detection device 11 is for use in a power control unit 1 electrically connected to a standard permanent magnet motor 5. The power control unit 1 is further electrically connected to a direct current (DC) power source 3. The power control unit 1 further comprises a power source transformation module 13 configured to transform the DC power of the single-phase DC power source 3 into a three-phase alternating current (AC) power for use by the standard permanent magnet motor 5. The demagnetization detection device 11 comprises a memory 111, a voltage detector 113, a current detector 115, and a processing unit 117 electrically connected to the memory 111, the voltage detector 113 and the current detector 115.

It shall be particularly appreciated that the basic functions of and connection relationships between the DC power source, the power control unit and the permanent magnet motor can be readily understand by those of ordinary skill in the art, so no further description will be made thereon herein. The functions of and interactions between the individual elements of the demagnetization detection device 11 will be detailed hereinafter.

Still in reference to FIG. 1A, before the demagnetization detection device 11 is actually used for demagnetization detection, an initial standardization process may be carried out by using a standard permanent magnet motor 5. Specifically, when the DC power source 3 supplies power to the standard permanent magnet motor 5 via the power control unit 1, a standard voltage value 20 and a standard current value 22 of the DC power source 3 can be detected respectively by the voltage detector 113 and the current detector 115 of the demagnetization detection device 11 disposed in the power control unit 1.

Then, by using a standard loading device, the standard permanent magnet motor can generate a standard torque 42 and a standard rotation speed 44 and transmit the standard torque 42 and the standard rotation speed 44 to the processing unit 117. Meanwhile, the voltage detector 113 and the current detector 115 transmit the detected standard voltage value 20 and the standard current value 22 respectively to the processing unit 117 so that the processing unit 117 derives a standard power value 24 therefrom. Thus, through the aforesaid operations, a corresponding relation between the standard power value 24 and the standard torque 42 as well as the standard rotation speed 44 of the standard permanent magnet motor 5 can be known by the processing unit 117.

Also, with reference to FIG. 1B, there is a schematic view illustrating the corresponding relation between the standard power value 24 and the standard torque 42 as well as the standard rotation speed 44. Specifically, upon knowing the corresponding relation between the standard power value 24 and the standard torque 42 as well as the standard rotation speed 44 of the standard permanent magnet motor 5, the processing unit records the corresponding relation into the memory 117 in the form of a corresponding relation 26. Furthermore, the corresponding relation 26 is stored in the memory 111 in the form of a table. As shown, the standard power value 24 corresponds to the standard torque 42 and the standard rotation speed 44; in other words, when the torque and the rotation speed of the standard permanent magnet motor 5 reach the standard torque 42 and the standard rotation speed 44 respectively, the output power thereof is just the standard power value 24.

Figure 1C:
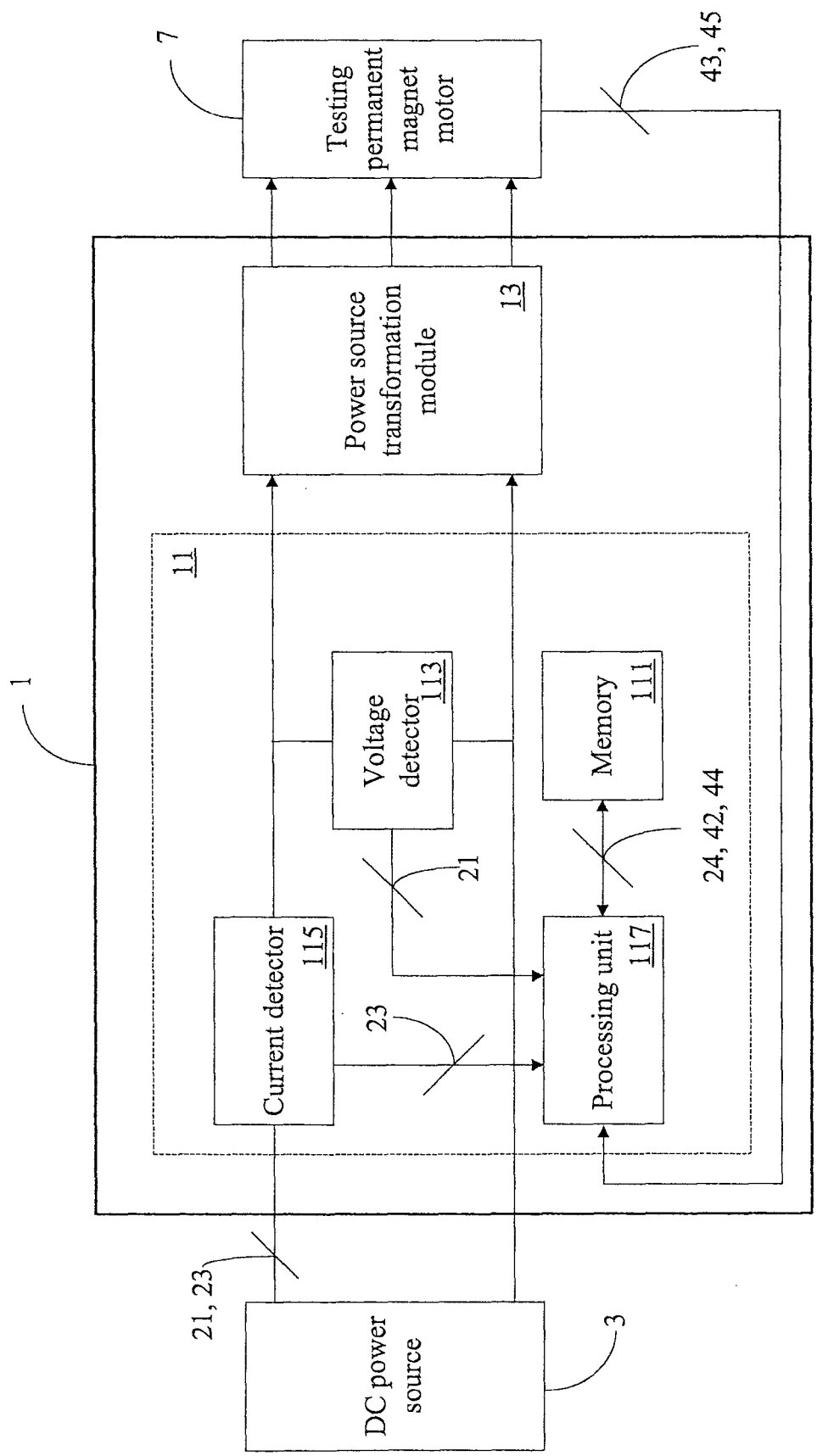
FIG. 1C is a schematic view illustrating how a demagnetization test is carried out by the demagnetization detection device according to the first embodiment of the present invention.

In the way described above, the demagnetization detection device can record the relation between the power output and the torque as well as the rotation speed of the permanent magnet motor during normal operation. Then, when other permanent magnet motors with the same properties are used, the demagnetization detection device will be able to determine whether they are in a demagnetization status. In more detail, FIG. 1C illustrates a schematic view illustrating how a demagnetization test is carried out by the demagnetization detection device 11 according to the first embodiment of the present invention. As shown therein, the standard permanent magnet motor 5 originally used in the initial standardization process has been replaced by a testing permanent magnet motor 7.

It shall be particularly appreciated that the connection relationships between the testing permanent magnet motor 7 and other elements (e.g., the power control unit 1 and the demagnetization detection device 11) are just the same as those between the standard permanent magnet motor 5 and other said elements, so no further description will be made thereon herein. Furthermore, for the convenience of description, the demagnetization detection device 11 of the first embodiment is applied to the standard permanent magnet motor 5 for initial standardization and then applied to the testing permanent magnet motor 7 to determine whether demagnetization occurs. However, this is not intended to limit the implementations of the present invention, and those skilled in the art can readily apply different demagnetization detection devices with the same functions as the standard permanent magnet motor and the testing permanent magnet motor respectively upon reviewing the above descriptions.

Similarly, when the DC power source 3 supplies power to the testing permanent magnet motor 7 through the power control unit 1 during the demagnetization test, a testing voltage value 20 and a testing current value 21 of the DC power source 3 can be detected respectively by the voltage detector 113 and the current detector 115 of the demagnetization detection device 11 disposed in the power control unit 1. Then, the voltage detector 113 and the current detector 115 transmits the testing voltage value 20 and the testing current value 23 to the processing unit 117 so that a testing power value (not shown) is calculated by the processing unit 117 according to the testing voltage value 20 and the testing current value 23.

Likewise, when the testing permanent magnet motor 7 operates at a different testing torque 43 and a different testing rotation speed 45, a testing voltage value 21 and a testing current value 23 can be detected by the voltage detector 113 and the current detector 115 respectively and transmitted to the processing unit 117. In this way, the corresponding relation between the testing power value and the testing torque 43 as well as the testing rotation speed 45 of the testing permanent magnet motor 7 can be known by the processing unit 117.

The memory 111 of the demagnetization detection device 11 has the standard power value 24 stored therein. Therefore, when the testing torque 43 is equal to the standard torque 42 and the testing rotation speed 45 is equal to the standard rotation speed 44, the processing unit 117 can determine the difference (not shown) between the testing power value and the standard power value 24 and determine whether the testing permanent magnet motor 7 is in a demagnetization status according to the difference.

In more detail, if the testing permanent magnet motor 7 is not in the demagnetization status when the testing torque 43 is equal to the standard torque 42 and the testing rotation speed 45 is equal to the standard rotation speed 44, the testing power value shall be theoretically equal to the standard power value 24 or the difference therebetween shall fall within a reasonable range. On the other hand, if the testing permanent magnet motor 7 is in the demagnetization status, then the testing power value and the standard power value 24 will present a significant difference therebetween. Therefore, the demagnetization of the permanent magnet motor 7 can be readily determined according to the difference between the testing power value and the standard power value 24.

It shall be particularly emphasized that the demagnetization detection device 11 of the present invention may also be readily applied to a system with two permanent magnet motors on the basis of the above disclosures; in other words, the demagnetization detection device 11 of the present invention can carry out a demagnetization test on the testing permanent magnet motor 7 while the power control unit 1 is electrically connected to both the standard permanent magnet motor 5 and the testing permanent magnet motor 7. To be more specific, the demagnetization detection device 11 of the present invention can perform the initial standardization process by using the standard permanent magnet motor 5 and carry out the test on the testing permanent magnet motor 7 simultaneously when both the standard permanent magnet motor 5 and the testing permanent magnet motor 7 are present in the system.

Additionally, the processing unit 117 may be further configured to define the standard power range (not shown) according to the standard power value 24, and determine whether the testing permanent magnet motor 7 is in the demagnetization status when the difference between the testing power value and the standard power value 24 is outside the standard power value. For example, the standard power range may be defined to range between 80% and 120% of the standard power value 24 in the first embodiment. By defining the standard power range, it is less likely for the processing unit 117 to make false determinations due to external factors, and this can increase the flexibility in determining whether the testing permanent magnet motor 7 is in the demagnetization status. However, the aforesaid definition of the standard power range is not intended to limit the implementations of the present invention, but may also be adjusted depending on different conditions.

It shall be particularly appreciated that for the convenience of understanding, the concepts of the present invention are described with reference to the corresponding relation between the single standard power value and single standard torque as well as the single standard rotation speed in the first embodiment; however, this is not intended to limit the implementations of the corresponding relation, and the corresponding relations between the different standard power values and different standard torques as well as the different standard rotation speeds may also be readily known by those skilled in the art upon reviewing the above disclosures.

Specifically, the different standard voltage values and standard current values of the DC power source can be detected by the voltage detector and the current detector of the present invention at different standard torques and standard rotation speeds of the standard permanent magnet motor. Then, a plurality of standard power values corresponding to the different standard torques and different rotation speeds can be calculated by the processing unit according to the standard voltage values. The standard current values that are detected can stored in the memory.

Thereby, the processing unit can calculate the testing power value in real time according to the testing torque and testing rotation speed of the testing permanent magnet motor under current operation conditions, then search from the memory a standard power value corresponding to a standard torque and a standard rotation speed that are equal to the testing torque and the testing rotation speed respectively, and finally determine whether there is a difference between the testing power value and the standard power value. If there is a difference between the testing power value and the standard power value, this means that the operation conditions of the testing permanent magnet motor are different from those of the standard permanent magnet motor and that the permanent magnet motor is in the demagnetization status.

It shall be appreciated that the power control unit is usually provided with a micro control unit (MCU) which also comprises a memory and a processor. Therefore, in different embodiments, the memory and the processing unit of the demagnetization detection unit and the MCU of the power control unit may be assigned to be responsible for different operational procedures respectively; however, with consideration of the cost and the arrangement of electronic components, the operational procedures for which the memory and the processing unit of the demagnetization detection device are responsible may also be embedded into the memory and the processing unit of the MCU of the power control unit. Therefore, the present invention has no limitation on the implementations of the memory and the processing unit of the demagnetization detection device.

The second embodiment of the present invention is a demagnetization detection method for use in a demagnetization detection device (e.g., the demagnetization detection device 11 of the first embodiment). Before the demagnetization detection device can be actually used for demagnetization detection, an initial standardization process must be carried out by use of a standard permanent magnet motor to record the statuses of a normal permanent magnet motor under various operation conditions. The demagnetization detection device is for use in a power control unit electrically connected to a standard permanent magnet motor. The power control unit is further electrically connected to a DC power source. The demagnetization detection device comprises a memory, a voltage detector, a current detector, and a processing unit electrically connected to the memory, the voltage detector and the current detector. The initial standardization process is described as follows.

Figure 2A:
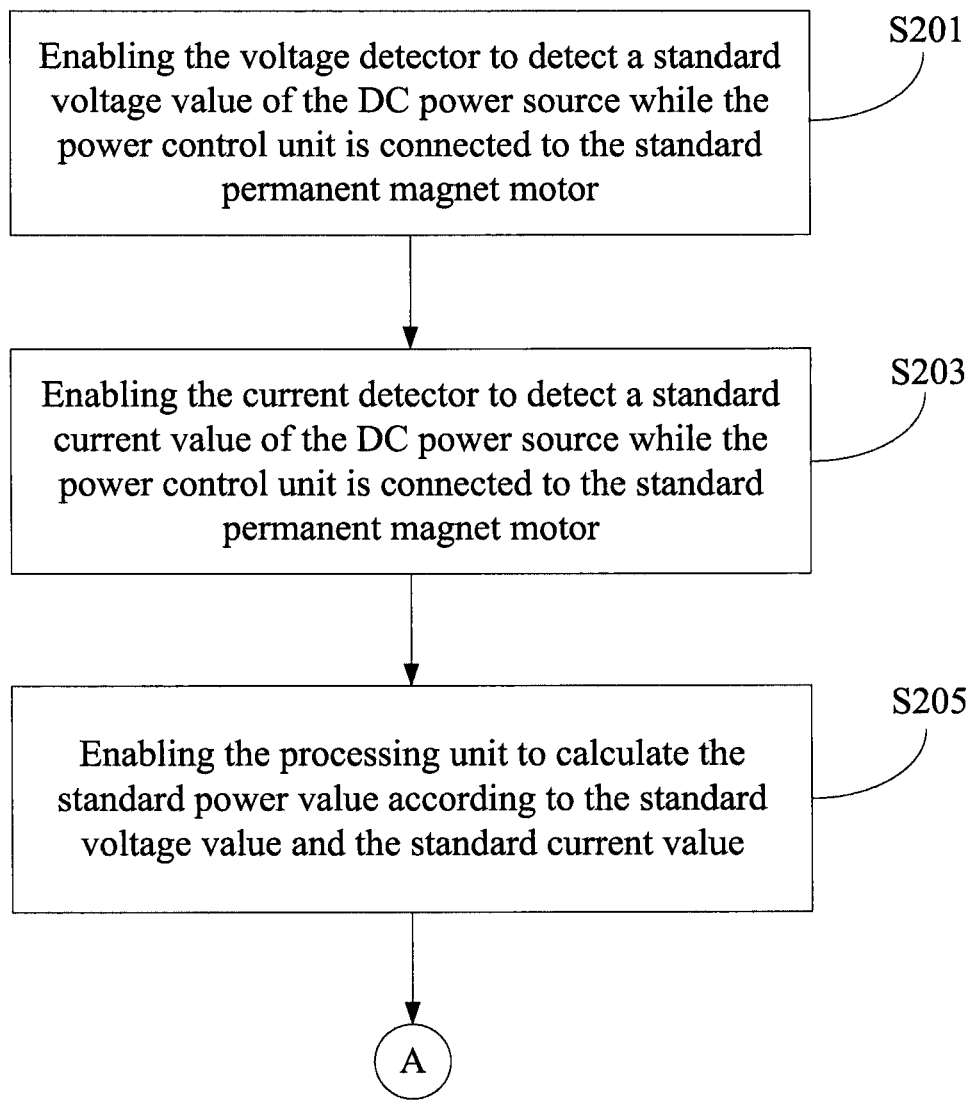
FIG. 2A is a flowchart of an initial standardization process of a demagnetization detection method according to a second embodiment of the present invention.

FIG. 2A illustrates a flowchart of the initial standardization process of the demagnetization detection method according to the second embodiment of the present invention. First, step S201 is executed to enable the voltage detector to detect a standard voltage value of the DC power source while the power control unit is connected to the standard permanent magnet motor. Then, step S203 is executed to enable the current detector to detect the standard current value of the DC power source while the power control unit is connected to the standard permanent magnet motor. Next, step S205 is executed to enable the processing unit to calculate the standard power value according to the standard voltage value and the standard current value.

It shall be particularly appreciated that for the standard permanent magnet motor, the standard voltage value and the standard current value are detected by the voltage detector and the current detector respectively at different standard torques and standard rotation speeds, and are then transmitted to the processing unit. Thus, the corresponding relation between the standard power value and the standard torque as well as the standard rotation speed of the standard permanent magnet motor can be known by the processing unit.

Figure 2B:
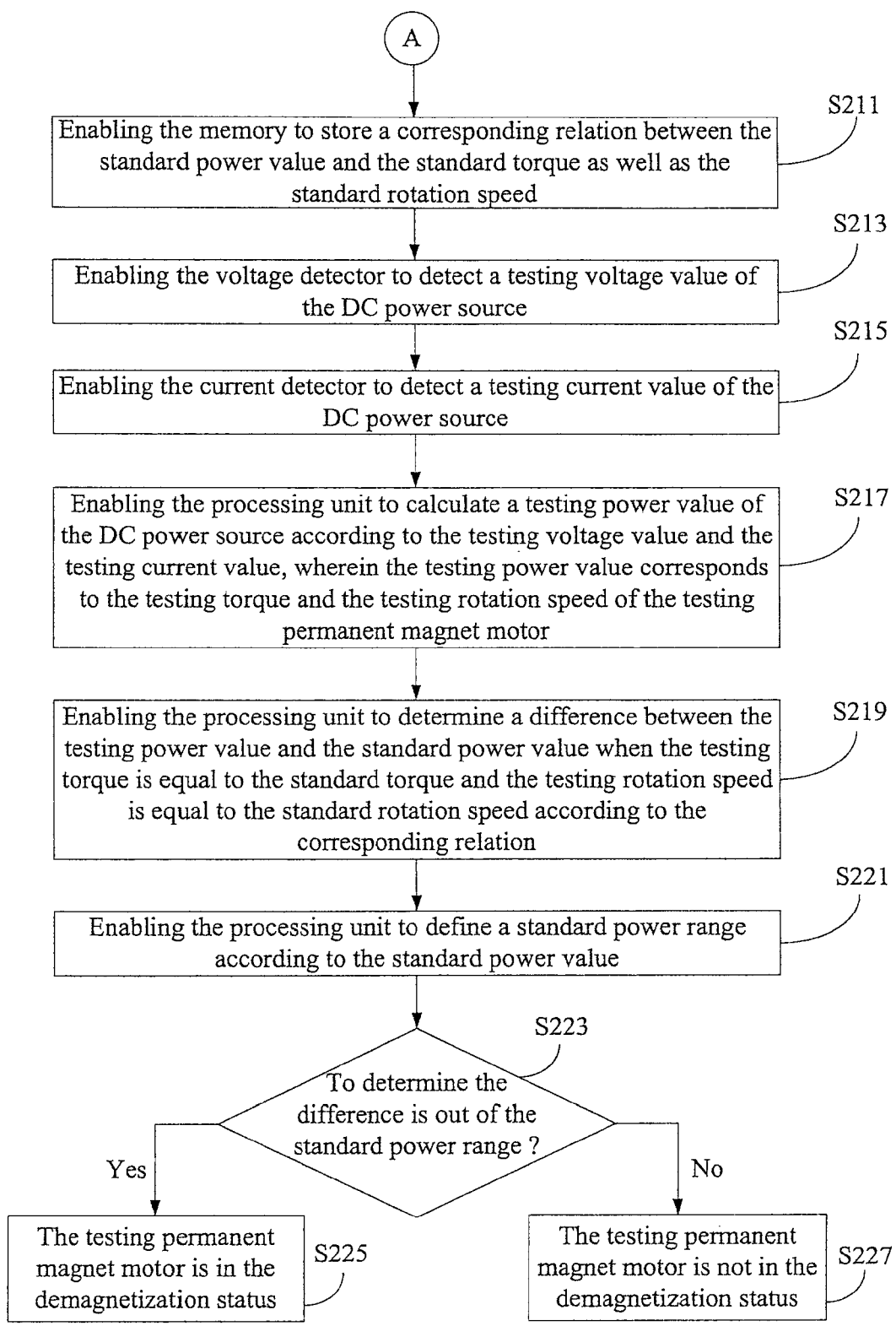
FIG. 2B is a flowchart of a demagnetization test performed by using the demagnetization detection method according to the second embodiment of the present invention.

As can be known from what is described above, the demagnetization detection device can record the relation between the power output and the torque as well as the rotation speed of the permanent magnet motor during normal operation. Then, when other permanent magnet motors with the same properties are used, it can be determined whether they are demagnetized. Next, FIG. 2B illustrates a flowchart of a demagnetization test performed by using the demagnetization detection method according to the second embodiment of the present invention.

In more detail, the standard permanent magnet motor originally used for the initial standardization process has been replaced by a testing permanent magnet motor before the demagnetization test is carried out. The connection relationships between the testing permanent magnet motor and other elements (e.g., the power control unit and the demagnetization detection device) are just the same as those between the standard permanent magnet motor and said other elements, so no further description will be made thereon herein. Step S211 is executed to enable the memory to store a corresponding relation between the standard power value and the standard torque as well as the standard rotation speed. It shall be particularly appreciated that step S211 may also be executed prior to the initial standardization process, and the main purpose thereof is to store the corresponding relation between the standard power value, the standard torque and the standard rotation speed into the memory.

Next, step S213 is executed to enable the voltage detector to detect a testing voltage value of the DC power source. Step S215 is executed to enable the current detector to detect a testing current value of the DC power source. It shall be appreciated that the step S213 and the step S215 may also be reversed in order or be executed at the same time, but are not merely limited to the aforesaid orders.

Subsequently, step S217 is executed to enable the processing unit to calculate the testing power value of the DC power source according to the testing voltage value and the testing current value. The testing power value corresponds to a testing torque and a testing rotation speed of the testing permanent magnet motor. Then, step S219 is executed to enable the processing unit to determine a difference between the testing power value and the standard power value when the testing torque is equal to the standard torque and the testing rotation speed is equal to the standard rotation speed according to the corresponding relation, and determine whether the testing permanent magnet motor is in a demagnetization status according to the difference.

More specifically, step 221 is executed to enable the processing unit to define a standard power range according to the standard power value. Similarly, the standard power range may be defined to range between 80% and 120% of the standard power value in the second embodiment. Next, step S223 is executed to enable the processing unit to determine whether the difference is out of the standard power range. If the answer is "yes", then step S225 is executed to determine that the testing permanent magnet motor is in the demagnetization status; otherwise, step S227 is executed to determine whether the testing permanent magnet motor is not in the demagnetization status. Similarly, the aforesaid definition of the standard power range is not intended to limit the implementations of the present invention, but may also be adjusted depending on different conditions.

It shall be particularly emphasized that because the results obtained from the initial standardization process may also be used for other testing permanent magnet motors of the same type, it is unnecessary to repeat the initial standardization process accomplished by the steps S201, S203 and S205. In other words, if the corresponding relation between the standard power value and the standard torque as well as the standard rotation speed has already been known, the steps S201, S203 and S205 may be omitted by the demagnetization detection device and, instead, step S211 is executed directly to enable the memory to store the corresponding relationship.

In addition to the aforesaid steps, the second embodiment can also execute all the operations and functions set forth in the first embodiment. The method in which the second embodiment executes these operations and functions will be readily appreciated by those of ordinary skill in the art based on the explanation of the first embodiment, and thus will not be further described herein.

According to the above descriptions, the demagnetization detection device and the demagnetization detection method thereof of the present invention are mainly for use in a power control unit electrically connected to a testing permanent magnet motor, and are used to determine whether the testing permanent magnet motor is in a demagnetization status by detecting the variations of a power value of a DC power source electrically connected to the power control unit. Thereby, the demagnetization detection device and the demagnetization detection method thereof of the present invention can detect whether the permanent magnet motor is in the demagnetization status more effectively and accurately to further ensure safety during the driving of an electromobile that uses the permanent magnet motor.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A demagnetization detection device for use in a power control unit which is electrically connected to a testing permanent magnet motor, the power control unit being further electrically connected to a direct current power source, the demagnetization detection device comprising:
   a memory, being configured to store a corresponding relation of a standard power value corresponding to a standard torque and a standard rotation speed of a standard permanent magnet motor;
   a voltage detector, being configured to detect a testing voltage value of the direct current power source;
   a current detector, being configured to detect a testing current value of the direct current power source; and
   a processing unit, being electrically connected to the memory, the voltage detector and the current detector and being configured to calculate a testing power value according to the testing voltage value and the testing current value, wherein the testing power value corresponds to a testing torque and a testing rotation speed of the testing permanent magnet motor;
   wherein the processing unit further determines a difference between the testing power value and the standard power value while the testing torque is equal to the standard torque and the testing rotation speed is equal to the standard rotation speed based on the corresponding relation, and further determines that the testing permanent magnet motor is in a demagnetization status according to the difference.

2. The demagnetization detection device as claimed in claim 1, wherein the processing unit further defines a standard power range according to the standard power value, and determines that the testing permanent magnet motor is in the demagnetization status when the difference is out of the standard power range.

3. The demagnetization detection device as claimed in claim 2, wherein the standard power range is between 80% and 120% of the standard power value.

4. The demagnetization detection device as claimed in claim 1, wherein the standard power value is calculated according to a standard voltage value detected by the voltage detector and a standard current value detected by the current detector when the power control unit is electrically connected to the standard permanent magnet motor.

5. A demagnetization detection method for use in a demagnetization detection device, the demagnetization detection device being for use in a power control unit which is electrically connected to a testing permanent magnet motor, the power control unit being further electrically connected to a direct current power source, the demagnetization detection method comprising the following steps of:
   (a) storing a corresponding relation between a standard power value and a standard torque as well as a standard rotation speed of a standard permanent magnet motor;
   (b) detecting a testing voltage value of the direct current power source;
   (c) detecting a testing current value of the direct current power source;
   (d) calculating a testing power value according to the testing voltage value and the testing current value, wherein the testing power value corresponds to a testing torque and a testing rotation speed of the testing permanent magnet motor; and
   (e) determining a difference between the testing power value and the standard power value for determining that the testing permanent magnet motor is in a demagnetization status while the testing torque is equal to the standard torque and the testing rotation speed is equal to the standard rotation speed based on the corresponding relation.

6. The demagnetization detection method as claimed in claim 5, wherein the step (e) further comprises the following steps of:
   (e1) defining a standard power range according to the standard power value; and
   (e2) determining that the testing permanent magnet motor is in the demagnetization status when the difference is out of the standard power range.

7. The demagnetization detection method as claimed in claim 6, wherein the standard power range is between 80% and 120% of the standard power value.

8. The demagnetization detection method as claimed in claim 5, further comprising the following steps before the step (a):

(a1) detecting a standard voltage value when the power control unit is electrically connected to the standard permanent magnet motor;
(a2) detecting a standard current value when the power control unit is electrically connected to the standard permanent magnet motor; and
(a3) calculating the standard power value according to the standard voltage value and the standard current value.

\* \* \* \* \*